United States Patent
Holmes et al.

(10) Patent No.: US 9,269,621 B2
(45) Date of Patent: Feb. 23, 2016

(54) DUAL DAMASCENE DUAL ALIGNMENT INTERCONNECT SCHEME

(71) Applicant: GLOBALFOUNDRIES INC., Grand Cayman (KY)

(72) Inventors: Steven J. Holmes, Albany, NY (US); David V. Horak, Essex Junction, VT (US); Charles W. Koburger, III, Delmar, NY (US); Shom Ponoth, Gaithersburg, MD (US); Chih-Chao Yang, Glenmont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/449,314

(22) Filed: Aug. 1, 2014

(65) Prior Publication Data

US 2014/0342549 A1 Nov. 20, 2014

Related U.S. Application Data

(62) Division of application No. 13/490,542, filed on Jun. 7, 2012, now Pat. No. 8,803,321.

(51) Int. Cl.
*H01L 21/311* (2006.01)
*H01L 21/44* (2006.01)
*H01L 21/768* (2006.01)
*H01L 23/522* (2006.01)

(52) U.S. Cl.
CPC .... *H01L 21/76897* (2013.01); *H01L 21/76807* (2013.01); *H01L 21/76808* (2013.01); *H01L 21/76811* (2013.01); *H01L 21/76819* (2013.01); *H01L 21/76831* (2013.01); *H01L 21/76832* (2013.01); *H01L 21/76834* (2013.01); *H01L 21/76883* (2013.01); *H01L 23/5226* (2013.01); *H01L 2924/0002* (2013.01)

(58) Field of Classification Search
USPC .......................... 257/774; 438/667, 697, 700
See application file for complete search history.

(56) References Cited

U.S. PATENT DOCUMENTS

| | | | |
|---|---|---|---|
| 5,614,765 A | 3/1997 | Avanzino et al. | |
| 5,888,897 A | 3/1999 | Liang | |
| 6,323,118 B1 | 11/2001 | Shih et al. | |
| 6,372,641 B1 | 4/2002 | Lien | |
| 6,426,249 B1 * | 7/2002 | Geffken | H01L 28/55 257/E21.009 |
| 6,472,310 B1 | 10/2002 | Achuthan et al. | |
| 6,498,092 B2 | 12/2002 | Lee et al. | |
| 6,737,747 B2 | 5/2004 | Barth et al. | |
| 6,787,875 B2 | 9/2004 | Brennan et al. | |

(Continued)

*Primary Examiner* — Marc Armand
*Assistant Examiner* — Wilner Jean Baptiste
(74) *Attorney, Agent, or Firm* — Scully, Scott, Murphy & Presser, P.C.

(57) ABSTRACT

A stack of a first metal line and a first dielectric cap material portion is formed within a line trench of first dielectric material layer. A second dielectric material layer is formed thereafter. A line trench extending between the top surface and the bottom surface of the second dielectric material layer is patterned. A photoresist layer is applied over the second dielectric material layer and patterned with a via pattern. An underlying portion of the first dielectric cap material is removed by an etch selective to the dielectric materials of the first and second dielectric material layer to form a via cavity that is laterally confined along the widthwise direction of the line trench and along the widthwise direction of the first metal line. A dual damascene line and via structure is formed, which includes a via structure that is laterally confined along two independent horizontal directions.

16 Claims, 11 Drawing Sheets

(56) References Cited

U.S. PATENT DOCUMENTS

| | | |
|---|---|---|
| 7,361,991 B2 | 4/2008 | Saenger et al. |
| 7,867,897 B2 | 1/2011 | Gambino et al. |
| 7,902,613 B1 | 3/2011 | Pierrat |
| 7,960,245 B2 | 6/2011 | Bernstein et al. |
| 7,989,957 B2 | 8/2011 | Ireland |
| 8,026,166 B2 | 9/2011 | Bonilla et al. |
| 2004/0173912 A1 | 9/2004 | Rhodes |
| 2009/0206489 A1* | 8/2009 | Li et al. .................. 257/774 |
| 2010/0038782 A1 | 2/2010 | Yang et al. |
| 2011/0212616 A1 | 9/2011 | Seidel et al. |
| 2012/0280290 A1* | 11/2012 | Khakifirooz et al. ......... 257/288 |

* cited by examiner

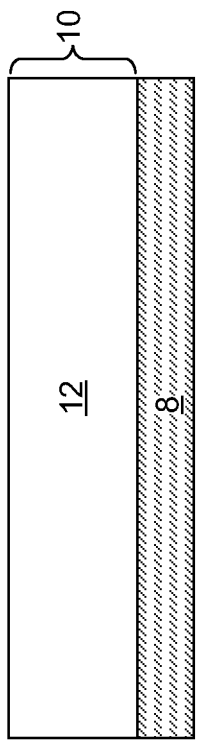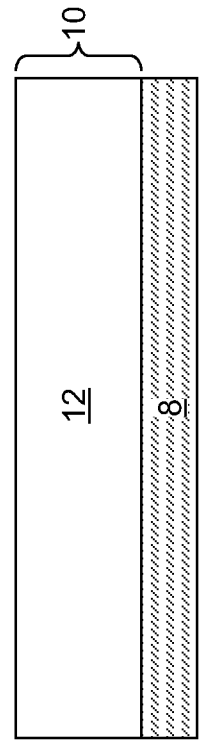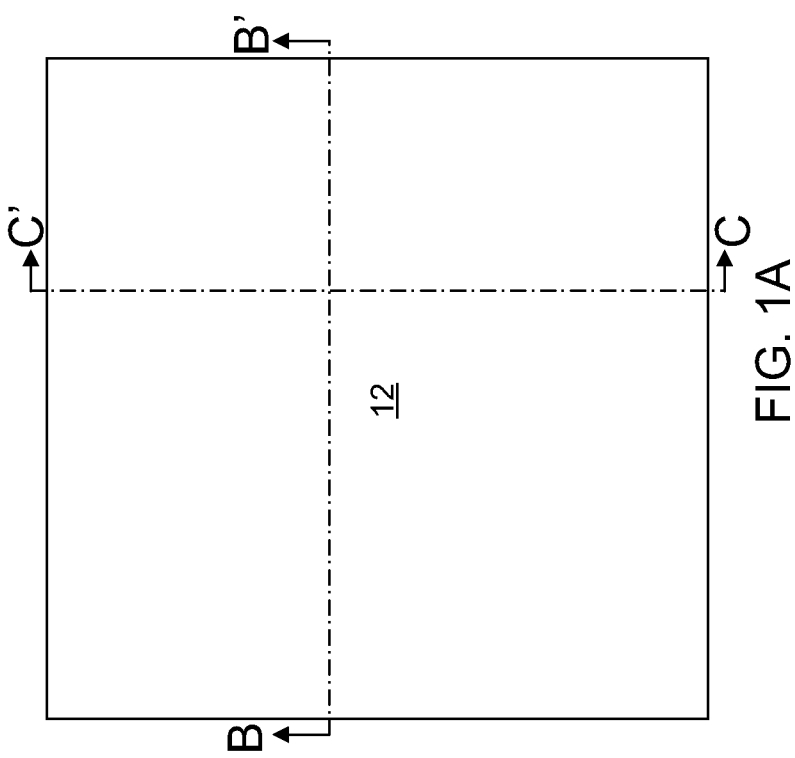

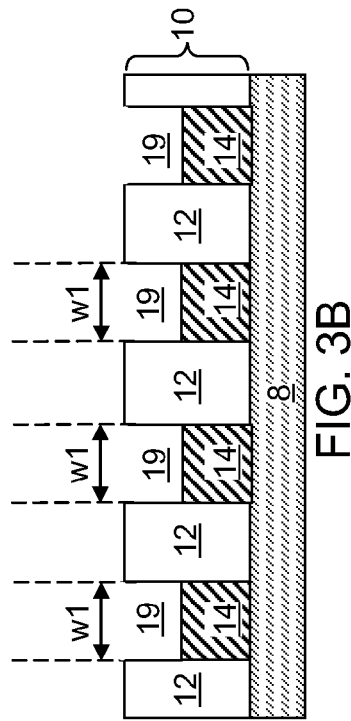
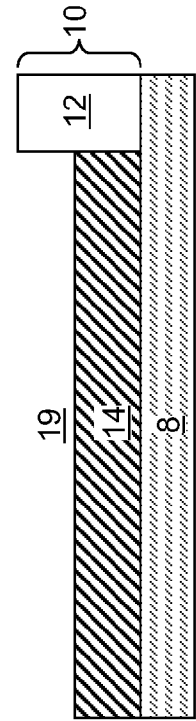
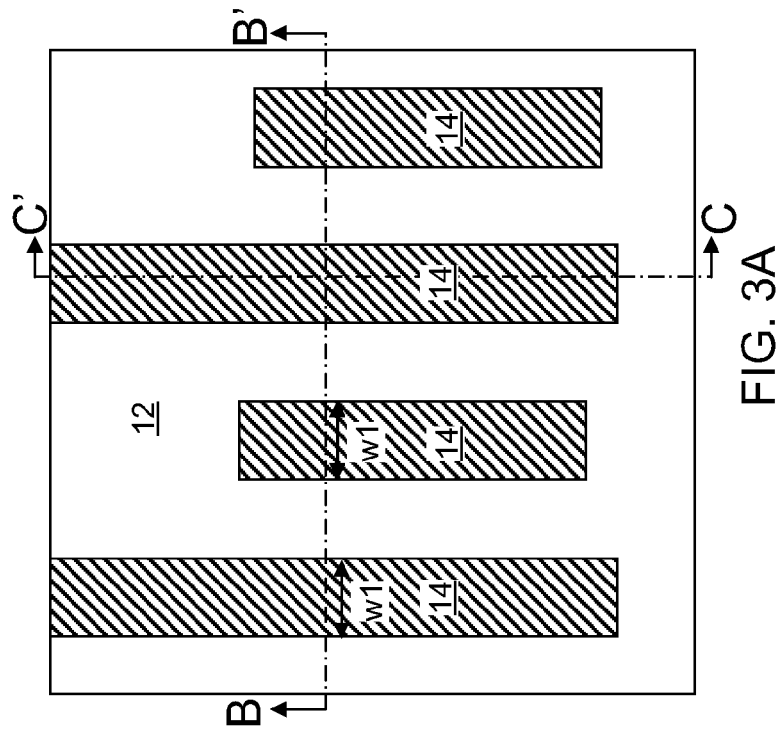

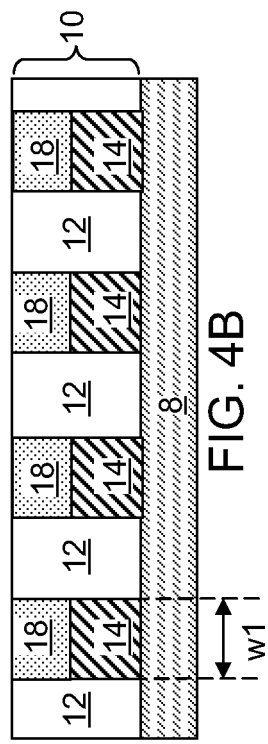
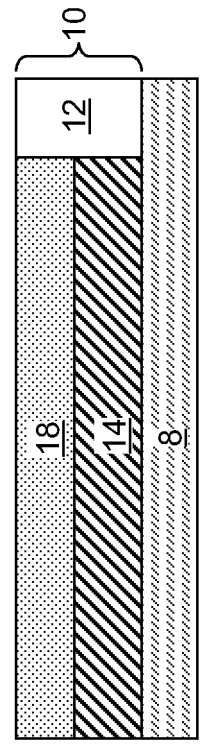
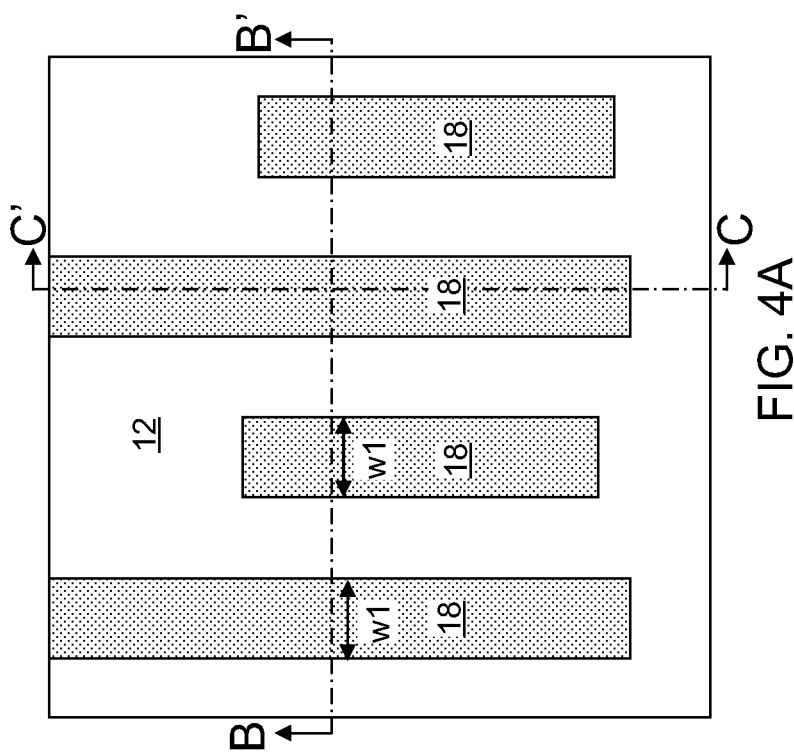
FIG. 4A
FIG. 4B
FIG. 4C

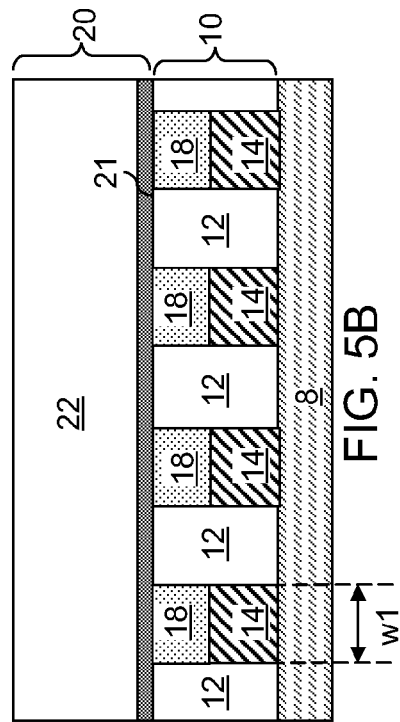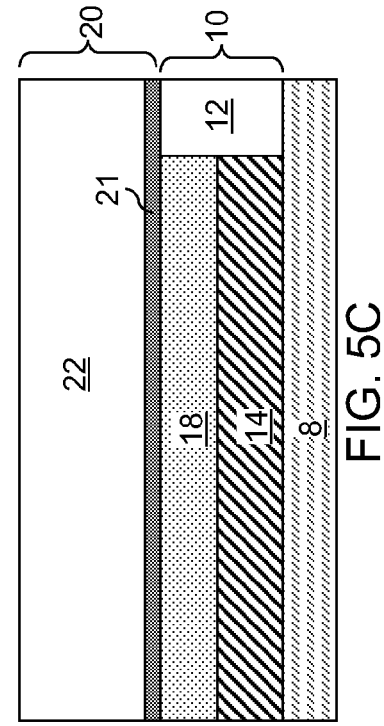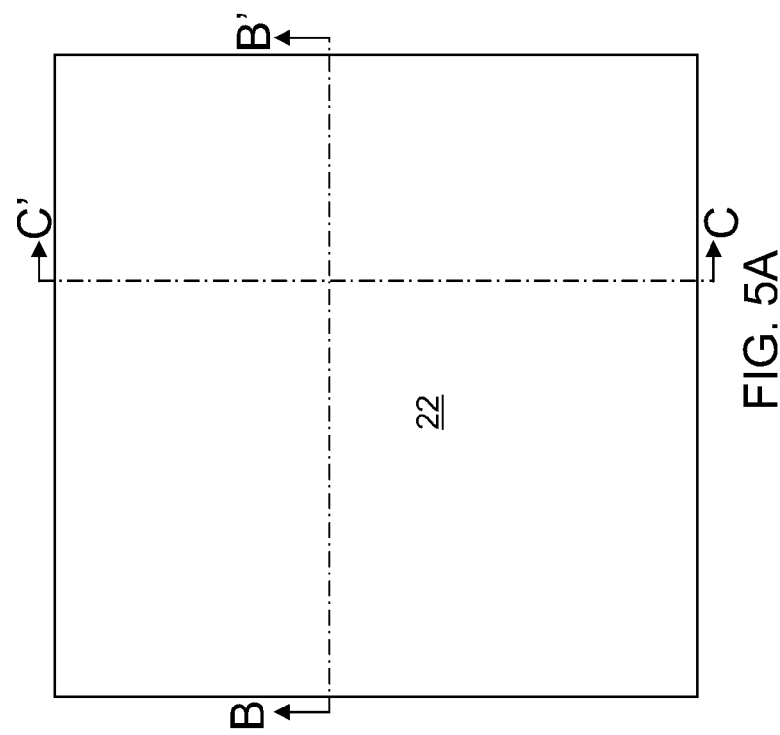

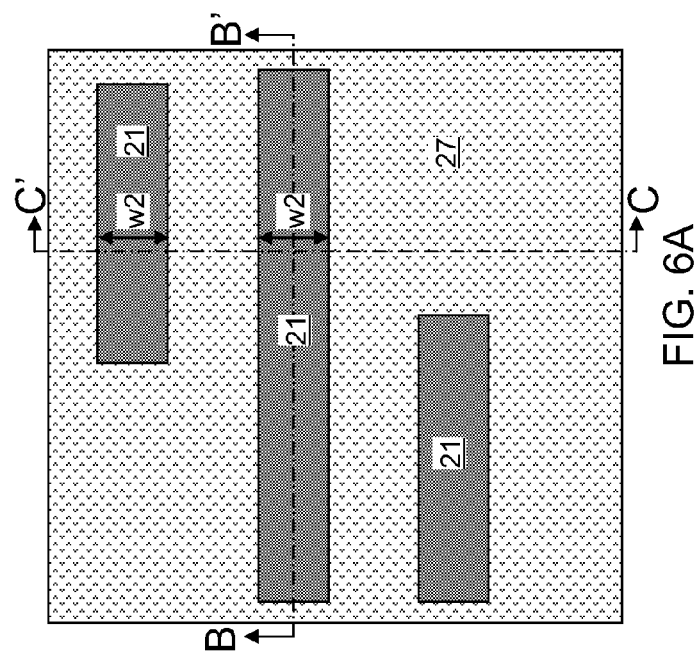
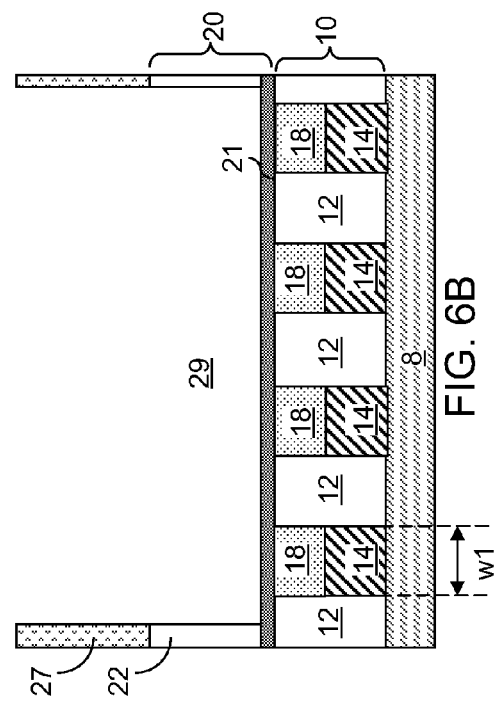
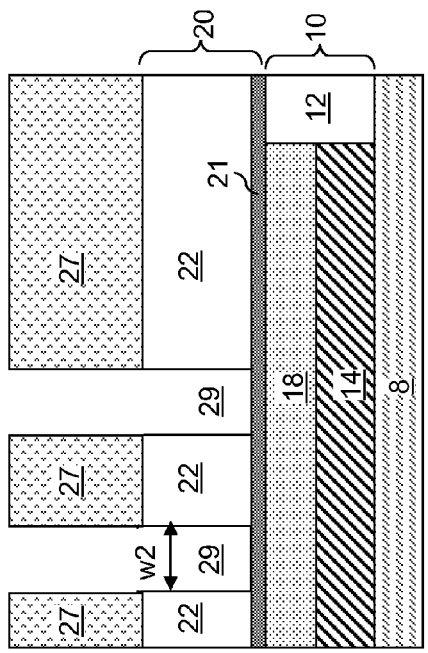
FIG. 6A
FIG. 6B
FIG. 6C

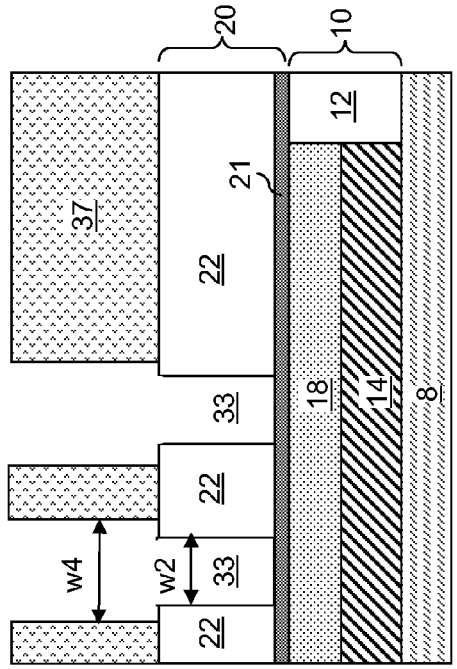
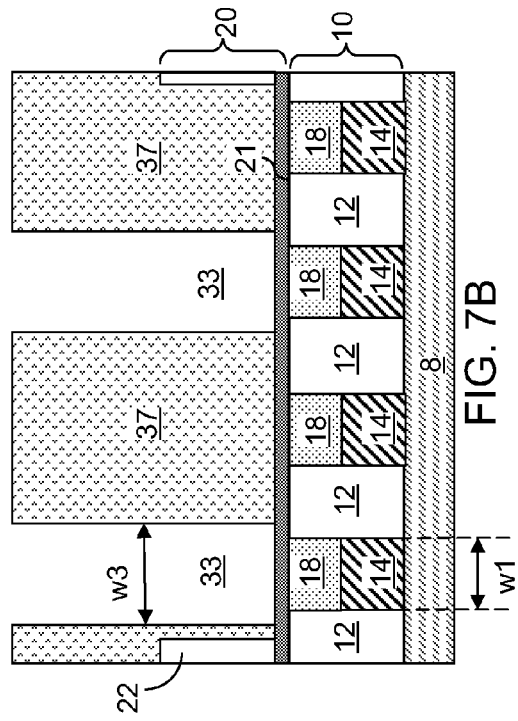
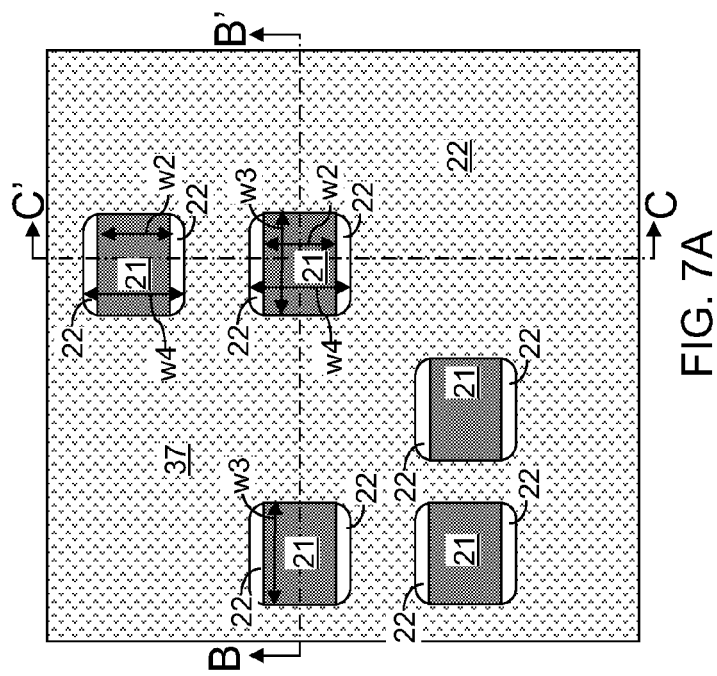

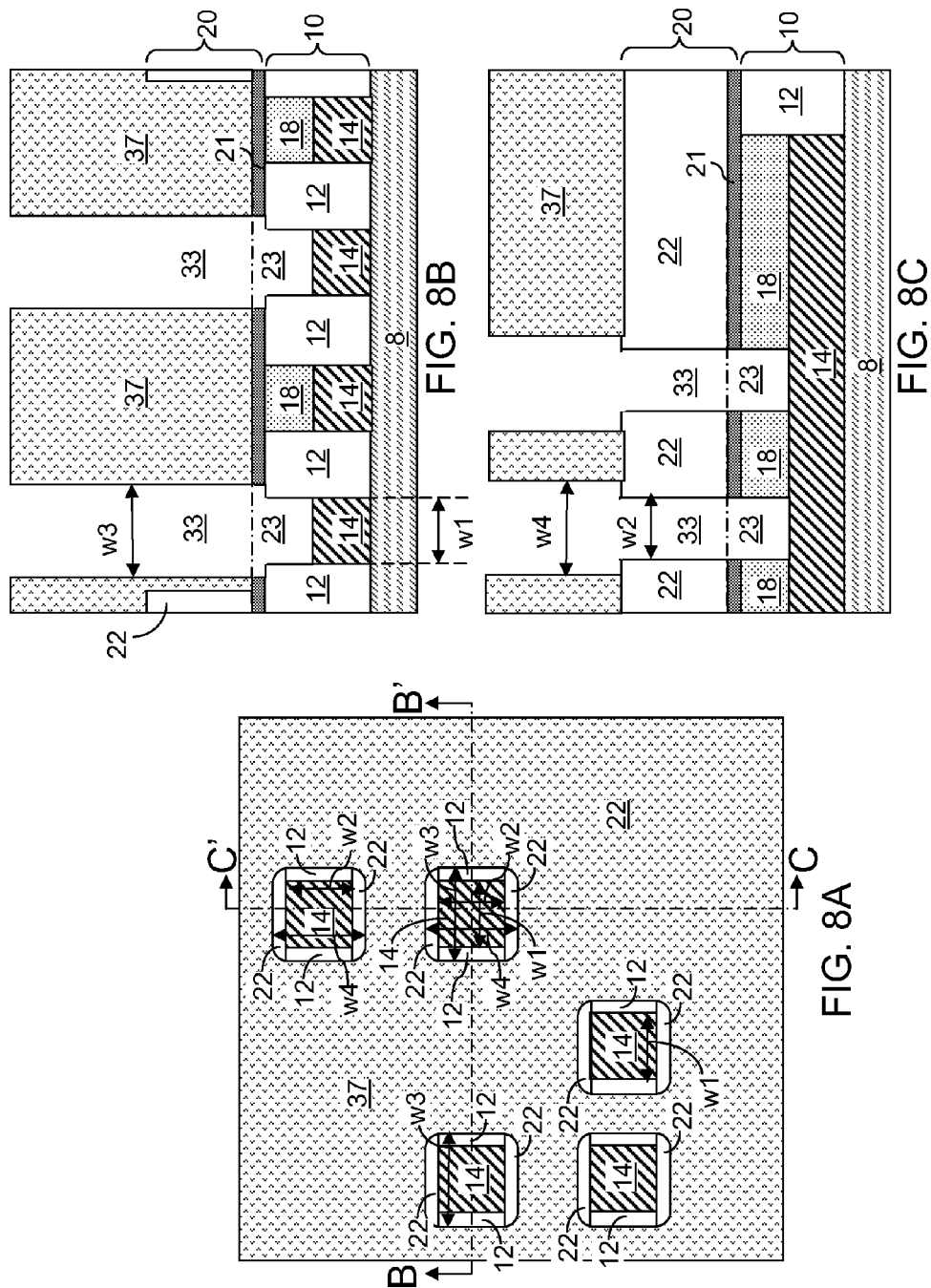

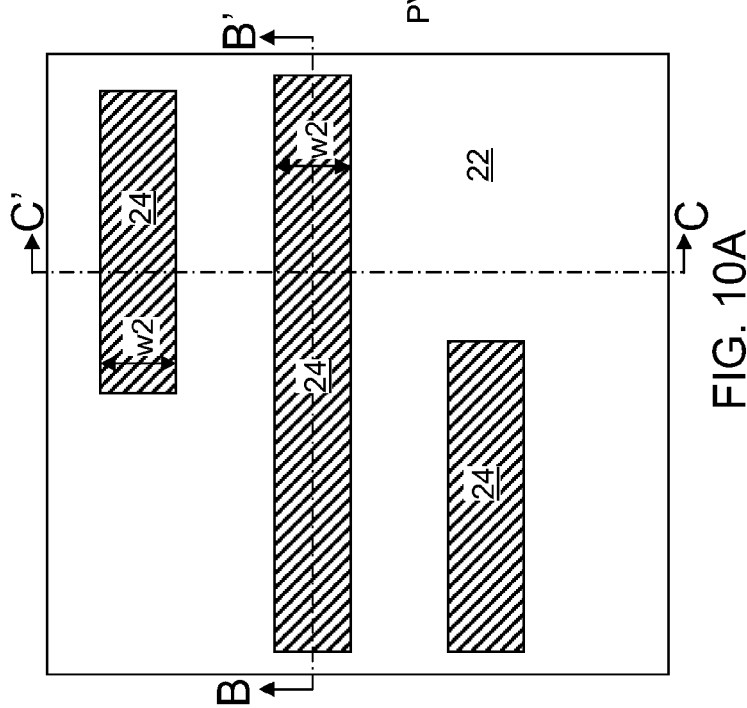
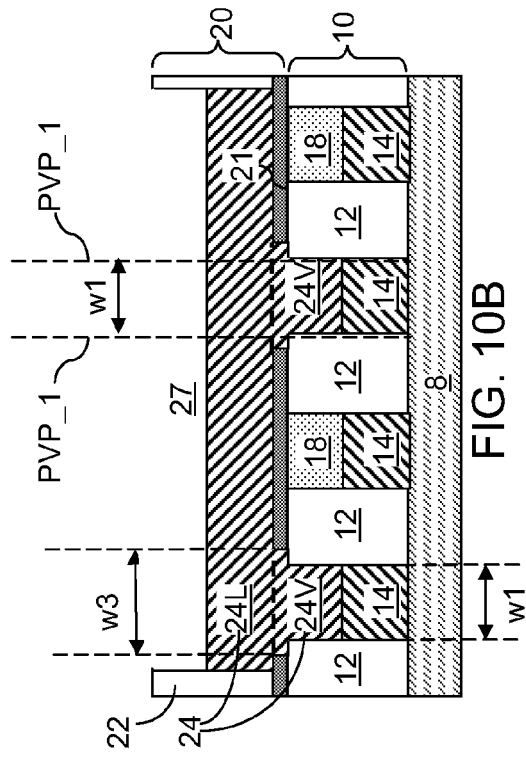
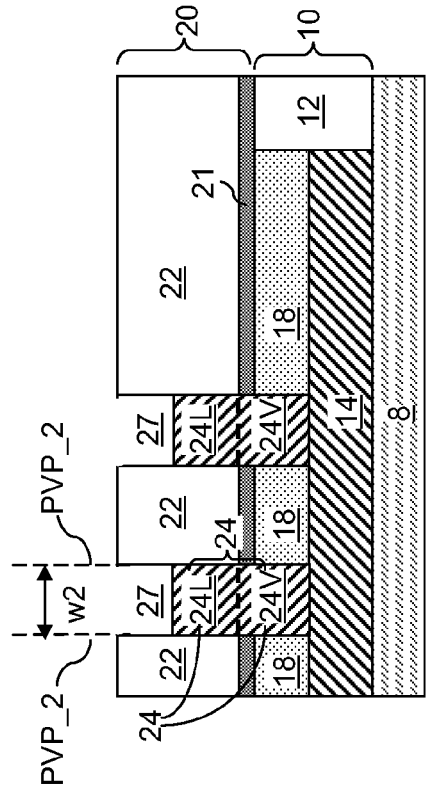
FIG. 10A
FIG. 10B
FIG. 10C

DUAL DAMASCENE DUAL ALIGNMENT INTERCONNECT SCHEME

BACKGROUND

The present disclosure relates to a metal interconnect structure, and particularly to a metal interconnect structure that includes an integrated line and via structure in which the via structure is self-aligned in two independent horizontal directions, and methods of manufacturing the same.

Alignment of a via structure to an underlying metal line is important in order to prevent yield degradation due to undesired electrical opens or undesired electrical shorts that are detected during testing, or reliability issues that arise during the operation of a semiconductor chip due to degradation of electrical contacts. Conventional dual damascene methods do not provide a mechanism to systematically prevent overextension of a via structure to an adjacent underlying metal line. Thus, overlay issues during lithographic patterning of via cavities can result in immediate or potential electrical shorts, and depress the yield and/or cause a reliability failure of a semiconductor chip.

BRIEF SUMMARY

A metal-line-containing structure including at least a first metal line is formed within a line trench of first dielectric material layer. The metal-line-containing structure is recessed below the top surface of the first dielectric material layer, and a cavity above the metal-line-containing structure is filled with a first dielectric cap material. An etch stop dielectric layer and a second dielectric material layer are formed thereafter. A line trench extending between the top surface and the bottom surface of the second dielectric material layer is patterned. A photoresist layer is applied over the second dielectric material layer and patterned with a via pattern that includes an opening for a via hole. The resulting via hole is laterally confined along a widthwise direction of a line trench within the second dielectric material layer. The etch stop dielectric layer is etched through, and an underlying portion of the first dielectric cap material is removed by an etch selective to the dielectric materials of the first and second dielectric material layer to form a via cavity that is laterally confined along the widthwise direction of the line trench and along the widthwise direction of the first metal line. A dual damascene line and via structure can be formed, which includes a via structure that is laterally confined along two independent horizontal directions.

According to an aspect of the present disclosure, a metal interconnect structure includes a dielectric material stack. The dielectric material stack includes at least a first dielectric material layer and a second dielectric material layer overlying the first dielectric material layer. The metal interconnect structure further includes a stack, from bottom to top, of a first metal line and a dielectric cap material portion. The stack is located within the first dielectric material layer. In addition, the metal interconnect structure includes a dual damascene line and via structure, which includes a second metal line and a via structure. The second metal line is embedded within the second dielectric material layer and the via structure is embedded within the first dielectric material layer.

According to another aspect of the present disclosure, a method of forming a metal interconnect structure is provided. A first line trench is formed within a first dielectric material layer on a substrate. A stack, from bottom to top, of a first metal line and a dielectric cap material portion is formed within the first line trench. A second dielectric material layer is formed over the first dielectric material layer. A second line trench is formed within the second dielectric material layer. A via cavity extending to a top surface of the first metal line is formed underneath the second line trench by removing a portion of the dielectric cap material portion. A dual damascene line and via structure including a second metal line and a via structure is formed within the second line trench and the via cavity.

According to yet another aspect of the present disclosure, another method of forming a semiconductor structure is provided. A first dielectric material layer on a substrate. A stack, from bottom to top, of a first metal line and a dielectric cap material portion is formed within the first dielectric material layer. The stack has a first width in a first direction perpendicular to a lengthwise direction of the stack. A second dielectric material layer is formed over the first dielectric material layer. Subsequently, a dual damascene line and via structure including a second metal line and a via structure is formed. The second metal line is embedded within the second dielectric material layer, and the via structure is embedded within the first dielectric material layer. The dual damascene line and via structure has a second width in a second direction perpendicular to a lengthwise direction of the dual damascene line and via structure. The via structure has the first width in the first direction.

BRIEF DESCRIPTION OF SEVERAL VIEWS OF THE DRAWINGS

FIG. 1A is a schematic top-down view of an exemplary metal interconnect structure after formation of a first dielectric material layer on a substrate according to an embodiment of the present disclosure.

FIG. 1B is a schematic vertical cross-sectional view of the exemplary metal interconnect structure of FIG. 1A along the B-B' plane according to an embodiment of the present disclosure.

FIG. 1C is a schematic vertical cross-sectional view of the exemplary metal interconnect structure of FIG. 1A along the C-C' plane according to an embodiment of the present disclosure.

FIG. 3A is a schematic top-down view of the exemplary metal interconnect structure after formation of first metal lines according to an embodiment of the present disclosure.

FIG. 3B is a schematic vertical cross-sectional view of the exemplary metal interconnect structure of FIG. 3A along the B-B' plane according to an embodiment of the present disclosure.

FIG. 3C is a schematic vertical cross-sectional view of the exemplary metal interconnect structure of FIG. 3A along the C-C' plane according to an embodiment of the present disclosure.

FIG. 4A is a schematic top-down view of the exemplary metal interconnect structure after formation of first dielectric cap material portions according to an embodiment of the present disclosure.

FIG. 4B is a schematic vertical cross-sectional view of the exemplary metal interconnect structure of FIG. 4A along the B-B' plane according to an embodiment of the present disclosure.

FIG. 4C is a schematic vertical cross-sectional view of the exemplary metal interconnect structure of FIG. 4A along the C-C' plane according to an embodiment of the present disclosure.

FIG. 5A is a schematic top-down view of the exemplary metal interconnect structure after formation of an etch stop layer and a second dielectric material layer according to an embodiment of the present disclosure.

FIG. 5B is a schematic vertical cross-sectional view of the exemplary metal interconnect structure of FIG. 5A along the B-B' plane according to an embodiment of the present disclosure.

FIG. 5C is a schematic vertical cross-sectional view of the exemplary metal interconnect structure of FIG. 5A along the C-C' plane according to an embodiment of the present disclosure.

FIG. 6A is a schematic top-down view of the exemplary metal interconnect structure after formation of second line trenches according to an embodiment of the present disclosure.

FIG. 6B is a schematic vertical cross-sectional view of the exemplary metal interconnect structure of FIG. 6A along the B-B' plane according to an embodiment of the present disclosure.

FIG. 6C is a schematic vertical cross-sectional view of the exemplary metal interconnect structure of FIG. 6A along the C-C' plane according to an embodiment of the present disclosure.

FIG. 7A is a schematic top-down view of the exemplary metal interconnect structure after application and patterning of a photoresist layer with a via pattern according to an embodiment of the present disclosure.

FIG. 7B is a schematic vertical cross-sectional view of the exemplary metal interconnect structure of FIG. 7A along the B-B' plane according to an embodiment of the present disclosure.

FIG. 7C is a schematic vertical cross-sectional view of the exemplary metal interconnect structure of FIG. 7A along the C-C' plane according to an embodiment of the present disclosure.

FIG. 8A is a schematic top-down view of the exemplary metal interconnect structure after formation of via cavities employing the photoresist layer, the second dielectric material layer, and the first dielectric material layer as etch masks according to an embodiment of the present disclosure.

FIG. 8B is a schematic vertical cross-sectional view of the exemplary metal interconnect structure of FIG. 8A along the B-B' plane according to an embodiment of the present disclosure.

FIG. 8C is a schematic vertical cross-sectional view of the exemplary metal interconnect structure of FIG. 8A along the C-C' plane according to an embodiment of the present disclosure.

FIG. 10A is a schematic top-down view of the exemplary metal interconnect structure after formation of dual damascene line and via structures according to an embodiment of the present disclosure.

FIG. 10B is a schematic vertical cross-sectional view of the exemplary metal interconnect structure of FIG. 10A along the B-B' plane according to an embodiment of the present disclosure.

FIG. 10C is a schematic vertical cross-sectional view of the exemplary metal interconnect structure of FIG. 10A along the C-C' plane according to an embodiment of the present disclosure.

DETAILED DESCRIPTION

Figure 2B:
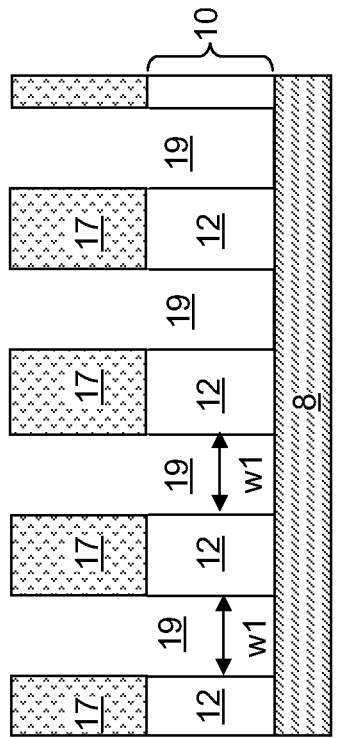
FIG. 2B is a schematic vertical cross-sectional view of the exemplary metal interconnect structure of FIG. 2A along the B-B' plane according to an embodiment of the present disclosure.

As stated above, the present disclosure relates to a metal interconnect structure that includes an integrated line and via structure in which the via structure is self-aligned in two independent horizontal directions, and methods of manufacturing the same. Aspects of the present disclosure are now described in detail with accompanying figures. It is noted that like and corresponding elements are referred to by like reference numerals. The drawings are not drawn to scale.

Referring to FIGS. 1A, 1B, and 1C, an exemplary metal interconnect structure according to an embodiment of the present disclosure can be formed by providing a substrate 8, and depositing a first dielectric material layer 12 on a top surface of the substrate 8. The substrate 8 can be a semiconductor substrate having at least one semiconductor device thereupon and/or therein, or can be a stack of a semiconductor substrate and at least one underlying metal interconnect structure that includes at least one conductive via, at least one conductive line, or a combination thereof within at least one underlying dielectric material layer.

The first dielectric material layer 12 includes a dielectric material that can be employed to embed a metal line and/or a metal via therein. For example, the first dielectric material layer 12 can include porous or non-porous organosilicate glass (OSG), undoped silicate glass, doped silicate glass, or a combination thereof. In one embodiment, the first dielectric material layer 12 includes porous or non-porous OSG, which can be deposited, for example, by chemical vapor deposition (CVD). The porous or non-porous OGS can include Si, C, O, H, and optionally N, and can have a dielectric constant less than 2.8. The thickness of the first dielectric material layer 12 can be from 30 nm to 1,000 nm, although lesser and greater thicknesses can also be employed. The first dielectric material layer 12 constitutes a first-level structure 10.

Figure 2C:
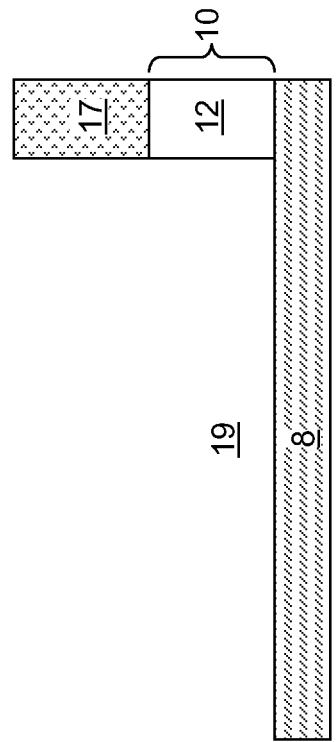
FIG. 2C is a schematic vertical cross-sectional view of the exemplary metal interconnect structure of FIG. 2A along the C-C' plane according to an embodiment of the present disclosure.
Figure 2A:
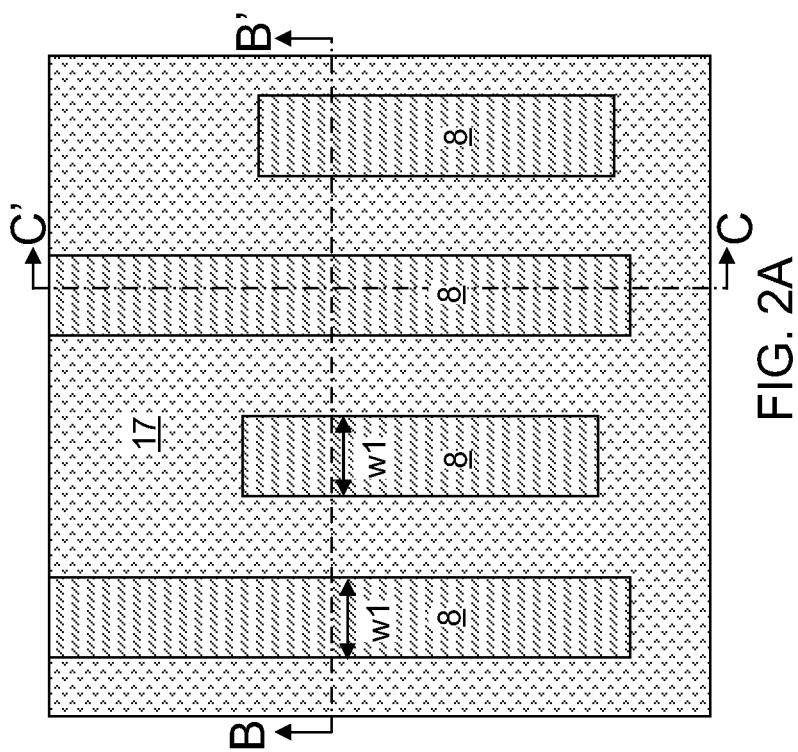
FIG. 2A is a schematic top-down view of the exemplary metal interconnect structure after formation of first line trenches according to an embodiment of the present disclosure.

Referring to FIGS. 2A, 2B, and 2C, a first photoresist layer 17 can be applied over the first dielectric material layer 12. The first photoresist layer 17 can be subsequently patterned with a first line pattern by lithographic exposure and development. The first line pattern can include a plurality of parallel lines that extend along a first horizontal lengthwise direction, which can be, for example, the horizontal direction within the C-C' plane. As used herein, a "lengthwise" direction of an element refers to a direction along which the element extends the most.

First line trenches 19 can be formed within the first dielectric material layer 12 by transferring the first line pattern in the first photoresist layer 17 into the first dielectric material layer 12. The pattern transfer from the first photoresist layer 17 into the first dielectric material layer 12 can be effected, for example, by an anisotropic etch that removes the dielectric material of the first dielectric material layer 12 employing the patterned first photoresist layer 17 as an etch mask. In one embodiment, the first line pattern in the first photoresist layer 17 can be transferred to the bottom surface of the first dielectric material layer 12, and a top surface of the substrate 8 can be physically exposed at the bottom of each first line trench 19. The first line trenches 19 can extend along the first horizontal lengthwise direction. The first photoresist layer 17 is subsequently removed selective to the first dielectric material layer 12 and the substrate 8, for example, by ashing. At least one of the first line trenches 19 can have a first width w1 along the horizontal direction that is perpendicular to the first horizontal lengthwise direction. The first-level structure 10 includes the first dielectric material layer 12 and the first line trenches 19.

Referring to FIGS. 3A, 3B, and 3C, at least one first conductive material can be deposited within the first line trenches 19. The at least one first conductive material can be a metallic material including at least one metallic element. The at least one first conductive material can include one or more of Cu, Al, Au, Ag, W, Ti, Ta, WN, TiN, TaN, WC, TiC, TaC, and alloys thereof. In one embodiment, a metallic liner including TiN can be deposited first, followed by deposition of Cu or a Cu-containing alloy material. The at least one first conductive material can be deposited, for example, by physical vapor deposition (PVD), chemical vapor deposition (CVD), electroplating, electroless plating, vacuum evaporation, or a combination thereof. In one embodiment, a metallic liner and a seed metal layer can be deposited by PVD, and another metallic layer can be deposited by electroplating.

The at least one first conductive material can be deposited to completely fill the first line trenches 19. The portion of the at least one first conductive material deposited over the top surface of the first dielectric material layer 12 can be removed, for example, by a recess etch, chemical mechanical planarization (CMP), or a combination thereof. In one embodiment, top surfaces of planarized portions of the at least one first conductive material can be substantially coplanar with the top surface of the first dielectric material layer 12.

Subsequently, top surfaces of the at least one first conductive material can be recessed to a height lower than the top surface of the first dielectric material layer 12, for example, by a recess etch. The recess etch can be a dry etch, such as a reactive ion etch, or a wet etch. The recess etch removes the at least one first conductive material selective to the dielectric material of the first dielectric material layer 12. In other words, the recess etch removes the at least one first conductive material while not removing the dielectric material of the first dielectric material layer by any substantial amount. The depth of recess, i.e., the vertical distance between the top surface of the first dielectric material layer 12 and the top surface of the recessed portions of the at least one first conductive material, can be from 10% to 90% of the thickness of the first dielectric material layer 12, although lesser and greater percentages can also be employed. In one embodiment, the depth of recess can be about 50% of the thickness of the first dielectric material layer 12.

The remaining portions of the at least one conductive material that fills lower portions of the first line trenches 19 constitute first metal lines 14. The first metal lines 14 extend along the first horizontal lengthwise direction. In one embodiment, at least one of the first metal lines 14 can have the first width w1. The first-level structure 10 includes the first dielectric material layer 12 and first line trenches 19, which include the first metal lines 14 in lower portions thereof.

Referring to FIGS. 4A, 4B, and 4C, first dielectric cap material portions 18 can be formed in remaining portions of the first line trenches 19. In one embodiment, the first dielectric cap material portions 18 can be formed by depositing a dielectric material that is different from the dielectric material of the first dielectric material layer 12, for example, by chemical vapor deposition, and by planarizing the deposited dielectric material employing the first dielectric material layer 12 as a stopping layer. In one embodiment, the first dielectric cap material portions 18 can include a material selected from silicon oxide, nitrogen-doped organosilicate glass, and silicon nitride. The planarization of the deposited dielectric material can be performed, for example, by chemical mechanical planarization (CMP), a recess etch, or a combination of CMP and a recess etch. In one embodiment, the top surface of each first dielectric cap material portion 18 can be coplanar with the top surface of the first dielectric material layer 12 after the planarizing.

In another embodiment, the first dielectric cap material portions 18 can be formed by depositing a self-planarizing dielectric material that is different from the dielectric material of the first dielectric material layer 12, for example, by spin-coating. For example, a spin-on-glass (SOG) material, or a self-planarizing low dielectric constant (low-k) dielectric material having a dielectric constant less than 3.9 (e.g., SiLK™) can be employed. Any excess portion of the self-planarizing dielectric material can be removed from above the top surface of the first dielectric material layer 12, for example, by a recess etch or CMP. In one embodiment, the top surface of each first dielectric cap material portion 18 can be coplanar with the top surface of the first dielectric material layer 12 after the recess etch or CMP.

In one embodiment, the first dielectric material layer 12 can include porous or non-porous organosilicate glass (OSG), and the first dielectric cap material portions 18 can include a material having a greater dielectric constant than the first dielectric material layer 12.

In another embodiment, the first dielectric material layer 12 can include non-porous OSG, and the first dielectric cap material portions 18 can include a porous OSG having a greater etch rate than the non-porous OSG of the first dielectric material layer 12.

A stack, from bottom to top, of a first metal line 14 and a first dielectric cap material portion 18 is formed within each of the first line trenches 19. Each stack (14, 18) is formed within the first dielectric material layer 12. The first-level structure 10 includes the stacks (14, 18) of first metal lines 14 and dielectric cap material portions 18.

Referring to FIGS. 5A, 5B, and 5C, an optional etch stop layer 21 and a second dielectric material layer 22 can be formed over the first-level structure 10. The optional etch stop layer 21 and the second dielectric material layer 22 collectively constitute a second-level structure 20.

The optional etch stop layer 21, if present, contiguously extends over the first dielectric material layer 12 and the first dielectric cap material portions 18. The optional etch stop layer 21 includes a material different from the materials of the first dielectric material layer 12, the second dielectric material layer 22, and the first dielectric cap material portions 18. For example, the optional etch stop layer 21 can include silicon nitride, silicon oxide, or a dielectric metal oxide material such as $HfO_2$, $ZrO_2$, and $LaO_2$. The thickness of the optional etch stop layer 21 can be from 1 nm to 20 nm, although lesser and greater thicknesses can also be employed.

The second dielectric material layer 22 includes a dielectric material that can be employed to embed a metal line and/or a metal via therein. For example, the second dielectric material layer 22 can include porous or non-porous organosilicate glass (OSG), undoped silicate glass, doped silicate glass, or a combination thereof. In one embodiment, the second dielectric material layer 22 includes porous or non-porous OSG. The porous or non-porous OGS can include Si, C, O, H, and optionally N, and can have a dielectric constant less than 2.8. The thickness of the second dielectric material layer 22 can be from 30 nm to 1,000 nm, although lesser and greater thicknesses can also be employed. The dielectric material of the second dielectric material layer 22 can be the same as, or can be different from, the dielectric material of the first dielectric material layer 12.

Referring to FIGS. 6A, 6B, and 6C, a second photoresist layer 27 can be applied over the second dielectric material layer 22. The second photoresist layer 27 can be subsequently patterned with a second line pattern by lithographic exposure and development. The second line pattern can include a plurality of parallel lines that extend along a second horizontal lengthwise direction, which can be, for example, the horizontal direction within the B-B' plane. In one embodiment, the second horizontal lengthwise direction can be perpendicular to the first horizontal lengthwise direction.

Second line trenches 29 can be formed within the second dielectric material layer 22 by transferring the second line pattern in the second photoresist layer 27 into the second dielectric material layer 22. The pattern transfer from the second photoresist layer 27 into the second dielectric material layer 22 can be effected, for example, by an anisotropic etch that removes the dielectric material of the second dielectric material layer 22 employing the patterned second photoresist layer 27 as an etch mask. In one embodiment, the second line pattern in the second photoresist layer 27 can be transferred to the bottom surface of the second dielectric material layer 22, and a top surface of the optional etch stop layer 21 or a top surface of the first dielectric material layer 12 can be physically exposed at the bottom of each second line trench 29. In one embodiment, the anisotropic etch can be selective to the optional etch stop layer 21, or to first dielectric material layer 12 if etch stop 21 is not present. The second line trenches 29 can extend along the second horizontal lengthwise direction.

The second photoresist layer 27 is subsequently removed selective to the second dielectric material layer 22 and the optional etch stop layer 21 (or the first dielectric material layer 12 if the optional etch stop layer 21 is not present), for example, by ashing. At least one of the second line trenches 29 can have a second width w2 along the horizontal direction that is perpendicular to the second horizontal lengthwise direction. In one embodiment, the first horizontal lengthwise direction can be perpendicular to the second horizontal lengthwise direction, and the direction of the second width w2 can be the same as the first horizontal lengthwise direction. The second-level structure 20 includes the second dielectric material layer 22, the second line trenches 29, and the optional etch stop layer 21.

Referring to FIGS. 7A, 7B, and 7C, a third photoresist layer 37 can be applied over the patterned second dielectric material layer 22. The third photoresist layer 37 can be subsequently patterned with a via pattern by lithographic exposure and development. The via pattern can include at least one via hole 33, of which a center portion overlaps with portions of the second line trenches 29.

After lithographic development of the third photoresist layer 37, the portion of each of the at least one via hole 33 above the topmost surface of the second dielectric material layer 22 can have a third width w3 along the lengthwise direction of the second line trenches 29 (See FIGS. 6A, 6B, and 6C), i.e., along the second horizontal lengthwise direction. Further, the portion of each of the at least one via hole 33 above the topmost surface of the second dielectric material layer 22 can have a fourth width w4 along the lengthwise direction of the first line trenches 19 (See FIGS. 2A, 2B, and 2C), i.e., along the first horizontal lengthwise direction.

The portion of each of the at least one via hole 33 below the topmost surface of the second dielectric material layer 22 is laterally bounded along the direction perpendicular to the second horizontal lengthwise direction (e.g., the horizontal direction contained within the plane C-C') by the width of the second line trenches 29 (See FIGS. 6A, 6B, and 6C). Thus, each of the at least one via hole 33 has the second width w2 along the direction perpendicular to the second horizontal lengthwise direction between the top surface and the bottom surface of the second dielectric material layer 22. The portion of each of the at least one via hole 33 below the topmost surface of the second dielectric material layer 22 may not be laterally bounded along the second horizontal lengthwise direction, and thus, may have the third width w3 between the topmost surface of the second dielectric material layer 22 and the bottom surface of the second dielectric material layer 22.

It is noted that the exemplary structure can be modified in different ways due to variations of lithographic processes employed to form the at least one via hole 33. For example, overlay variations can cause the pattern of the at least one via hole 33 to shift in a direction perpendicular to the second horizontal lengthwise direction (e.g., along the horizontal direction within the plane C-C'). If the overlay variations is greater than the nominal distance between the edge of a via hole 33 and a sidewall of a second line cavity 29 that the via hole 33 is designed to overlie, the overlay variations can cause an edge of the via hole 33 to be located between a pair of sidewalls of the second line cavity 29.

In another example, critical dimension (CD) variations can cause the area of a via hole 33 to be entirely within an area of a second line cavity 29 such that the via hole 33 does not include any edge that intersects the sidewalls of the second line cavity 29.

Referring to FIGS. 8A, 8B, and 8C, a via cavity 23 are formed underneath each of the at least one via hole 33 by an anisotropic etch that removes the optional etch stop layer 21 and the physically exposed regions of the first dielectric cap material portions 18. Physically exposed portions of the optional etch stop layer 21 can be etched employing the combination of the patterned third photoresist layer 37 and the second dielectric material layer 22 as the etch mask. Thus, a pattern that is an intersection of the via pattern and the pattern of the second line trenches 29 (See FIGS. 6A, 6B, and 6C) is transferred into the optional etch stop layer 21.

After removal of physically exposed portions of the optional etch stop layer 21, the anisotropic etch can remove the physically exposed regions of the first dielectric cap material portions 18 selective to the dielectric materials of the second dielectric material layer 22 and the first dielectric material layer 12. For example, if the first and second dielectric material layers (12, 22) include organosilicate glass (OSG) and if the first dielectric cap material portions 18 include a dielectric material other than OSG, an anisotropic etch that removes the dielectric material of the first dielectric cap material portions 18 can be employed to form the at least one via cavity 23.

During the anisotropic etch, the removed portions of the first dielectric cap material portions 18 are etched employing at least the first dielectric material layer 12 and the second dielectric material layer 22 as etch mask layers. In one embodiment, the combination of the first and second dielectric material layers (12, 22) and the patterned third photoresist layer 37 can be employed as the etch mask. Thus, each removed portion of the first dielectric cap material portions 18 can have a horizontal cross-sectional area of a composite pattern that is an intersection of the via pattern, a pattern of a second line trench 29, and a pattern of a first dielectric cap material portion 18.

Each via cavity 23 has the same width as the width, i.e., the second width w2, of the overlying second line trench 29 (See FIGS. 6A, 6B, 6C) along the direction perpendicular to the second horizontal lengthwise direction. The dimension of each via cavity 23 may not be limited along the second horizontal lengthwise direction within the optional etch stop layer 21, and thus, the dimension of each via cavity 23 can be the third width w3 along the second horizontal lengthwise direction between the top surface and the bottom surface of the etch stop layer 21.

Below the top surface of the first dielectric material layer 12, the width of each via cavity 23 along the direction perpendicular to the first horizontal lengthwise direction is the same as the width of the remaining portions of the first dielectric cap material portion 18 through which the via cavity 23 is formed because the anisotropic etch is selective to the dielectric material of the first dielectric material layer 12. Thus, the width of each via cavity 23 along the direction perpendicular to the first horizontal lengthwise direction can be the first width w1. Thus, the lateral dimensions of each via cavity 23 are limited in two directions below the top surface of the first dielectric material layer 12. Specifically, the width of each via cavity 23 along the direction perpendicular to the first horizontal lengthwise direction (which is herein referred to as a first-direction width) is limited by the width of the first dielectric cap material portions 18, and is the same as the first width w1. The width of each via cavity 23 along the direction perpendicular to the second horizontal lengthwise direction (which is herein referred to as a second-direction width) is limited by the width of the second line trenches 29 (See FIGS. 6A, 6B, and 6C), and is the same as the second width w2.

Each via cavity 23 is formed by removing portions of the etch stop layer 21 and portions of a first dielectric cap material portion 18. Each via cavity 23 underlies a second line trench 29, and extends from the bottom surface of the second dielectric material layer 22 to the top surface of a first metal line 12.

It is noted that the exemplary structure can be modified in different ways due to variations of lithographic processes employed to form the at least one via hole 33. For example, overlay variations can cause the pattern of at least one via cavity 23 to shift in a direction perpendicular to the first horizontal lengthwise direction (e.g., along the horizontal direction within the plane B-B'). If the overlay variations is greater than the nominal distance between an edge of a via hole 33 and a sidewall of a first line cavity 19 that the via hole 33 is designed to overlie, the overlay variations can cause an edge of the via cavity 23 to be located inside of the first line cavity 19 underlying the via hole 33. In this case, a sidewall of the via cavity can be laterally spaced from the first dielectric material layer 12 by a remaining portion of the first dielectric cap material portion 18.

In another example, critical dimension (CD) variations can cause the area of a via hole 33 to be entirely within an area of a first dielectric cap material portion 18 such that the via cavity 23 underneath the via hole 33 is laterally spaced from the first dielectric material layer by remaining portions of the first dielectric cap material portion 18.

Figure 9A:
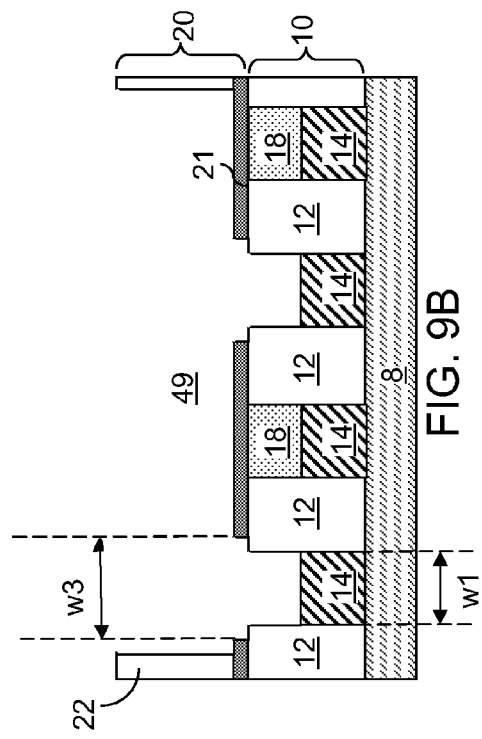
FIG. 9A is a schematic top-down view of the exemplary metal interconnect structure after removal of the photoresist layer according to an embodiment of the present disclosure.
Figure 9B:
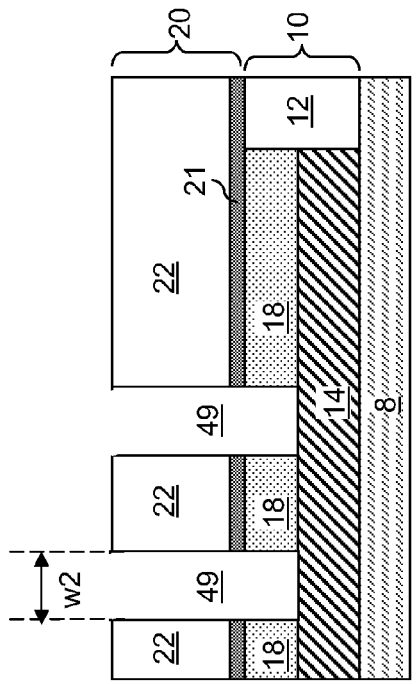
FIG. 9B is a schematic vertical cross-sectional view of the exemplary metal interconnect structure of FIG. 9A along the B-B' plane according to an embodiment of the present disclosure.
Figure 9C:
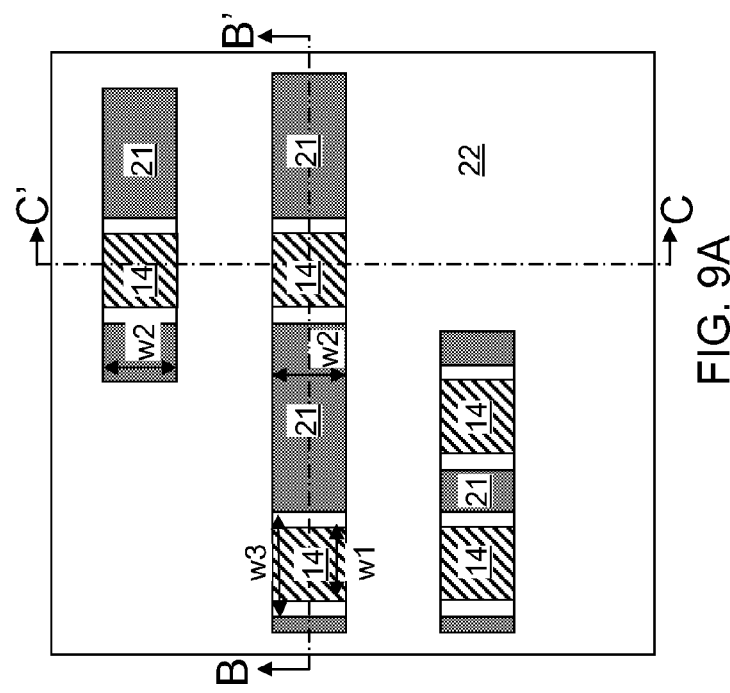
FIG. 9C is a schematic vertical cross-sectional view of the exemplary metal interconnect structure of FIG. 9A along the C-C' plane according to an embodiment of the present disclosure.

Referring to FIGS. 9A, 9B, and 9C, the third photoresist layer 37 is removed selectively to the dielectric materials of the first and second dielectric material layers (12, 22) and the optional etch stop layer 21, for example, by ashing. Dual damascene cavities 49 are formed after removal of the third photoresist layer 37. As used herein, a "dual damascene cavity" refers to a contiguous combination of a line trench and an underlying via cavity. Each dual damascene cavity 49 includes a second line trench 29 (See FIGS. 6A, 6B, 6C) and at least one via cavity 23.

Referring to FIGS. 10A, 10B, and 10C, dual damascene line and via structures 24 can be formed. As used herein, a "dual damascene line and via structure" refers to a metallic structure including a metal line and at least one via structure that are integrated as a single contiguous structure and does not include any interface between the metal line and any of the at least one via structure. Such a dual damascene line and via structure can be provided by forming the metal line and the at least one via structure simultaneously employing same processing steps to avoid formation of any microscopic interface at which a continuous grain boundary is formed and/or impurity materials and/or voids can be formed.

The dual damascene line and via structures 24 can be formed by depositing at least one second conductive material within the dual damascene cavities 49. The at least one second conductive material can be a metallic material including at least one metallic element. The at least one second conductive material can include one or more of Cu, Al, Au, Ag, W, Ti, Ta, WN, TiN, TaN, WC, TiC, TaC, and alloys thereof. In one embodiment, a metallic liner including TiN can be deposited first, followed by deposition of Cu or a Cu-containing alloy material. The at least one second conductive material can be deposited, for example, by physical vapor deposition (PVD), chemical vapor deposition (CVD), electroplating, electroless plating, vacuum evaporation, or a combination thereof. In one embodiment, a metallic liner and a seed metal layer can be deposited by PVD, and another metallic layer can be deposited by electroplating. The at least one second conductive material may, or may not, be the same as the at least one first conductive material of the first metal lines 14.

The at least one second conductive material can be deposited to completely fill the dual damascene cavities 49. The portion of the at least one second conductive material deposited over the top surface of the second dielectric material layer 22 can be removed, for example, by a recess etch, chemical mechanical planarization (CMP), or a combination thereof. In one embodiment, top surfaces of planarized portions of the at least one second conductive material can be substantially coplanar with the top surface of the second dielectric material layer 22.

Subsequently, top surfaces of the at least one second conductive material can be recessed to a height lower than the top surface of the second dielectric material layer 22, for example, by a recess etch. The recess etch can be a dry etch, such as a reactive ion etch, or a wet etch. The recess etch removes the at least one second conductive material selective to the dielectric material of the second dielectric material layer 22. In other words, the recess etch removes the at least one second conductive material while not removing the dielectric material of the second dielectric material layer by any substantial amount. The depth of recess, i.e., the vertical distance between the top surface of the second dielectric material layer 22 and the top surface of the recessed portions of the at least one second conductive material, can be from 20% to 90% of the thickness of the second dielectric material layer 22, although lesser and greater percentages can also be employed. In one embodiment, the depth of recess can be about 50% of the thickness of the second dielectric material layer 22.

The remaining portions of the at least one conductive material constitute the dual damascene line and via structures 24, and fill lower portions of the dual damascene trenches 49. The second metal lines 24 extend along the second horizontal lengthwise direction. In one embodiment, at least one of the second metal lines 24 can have the second width w1. The second-level structure 20 includes the second dielectric material layer 22 and second line trenches 29, which include the second metal lines 24 in lower portions thereof.

Each dual damascene line and via structure 24 can include a second metal line 24L and at least one via structure 24V. Each second metal line 24L is formed within a lower portion of a second line trench 29 (See FIGS. 6A, 6B, and 6C) within a dual damascene cavity 49, and each of the at least one via structure 24V is formed within a via cavity 23 within a dual damascene cavity 49. Each second metal line 24L is embedded within the second dielectric material layer 22, and each via structure 24V is embedded within the first dielectric material layer 12. Each dual damascene line and via structure 24 can be formed as an integral structure without a physically manifested interface between a second metal line 24L and each of at least one via structure 24V.

The first metal lines 14 extend along the first horizontal lengthwise direction (e.g., the horizontal direction within the plane C-C'), and the second metal lines 24L extend along the second horizontal lengthwise direction (e.g., the horizontal direction within the plane B-B') that is different from the first horizontal lengthwise direction. Each via structure 24V and the first metal line 14 that the via structure 24V contacts can have the same first width w1 along the horizontal direction (e.g., the second horizontal lengthwise direction of the second metal lines 24l) that is perpendicular to the first horizontal lengthwise direction.

As illustrated in FIG. 10B, each via structure 24V can include a first pair of parallel via sidewalls, and a first metal line 14 in contact with the via structure 24V can include a first pair of parallel line sidewalls. The first pair of parallel via sidewalls and the first pair of parallel line sidewalls can be located within a first set of two parallel vertical planes PVP_1 that are laterally spaced by the first width w1 and perpendicular to the first horizontal lengthwise direction. Thus, each via structure 24V can be self-aligned to a first metal line 14 located directly underneath.

Further, a via structure 24V and a second metal line 24L within a same dual damascene line and via structure 24 can have the same width, i.e., the second width w2, along the horizontal direction that is perpendicular to the second horizontal lengthwise direction.

As illustrated in FIG. 10C, each via structure 24V can include a second pair of parallel via sidewalls, and the second metal line 24L within the same dual damascene line and via structure 24 as the via structure 24V can include a second pair of parallel line sidewalls. The second pair of parallel via sidewalls and the second pair of parallel line sidewalls can be located within a second set of two parallel vertical planes PVP_2 that are laterally spaced by the second width w2 and perpendicular to the second horizontal lengthwise direction. Thus, each via structure 24V can be self-aligned to the second metal line 24L within the same dual damascene line and via structure 24.

If the optional etch stop layer 21 is present, each via structure 24V can have another width, i.e., the third width w3, that is greater than the first width w1 along the horizontal direction that is perpendicular to the first horizontal lengthwise direction within the vertical height range between the top surface of the etch stop layer 21 and the bottom surface of the etch stop layer 21. The optional etch stop layer 21 can contiguously extend over the first dielectric material layer 12 and the first dielectric cap material portions 18, and can laterally surround an upper portion of each via structure 24V.

It is noted that the exemplary structure can be modified in different ways due to variations of lithographic processes employed to form the at least one via hole 33. For example, overlay variations can cause the pattern of at least one via cavity 23 to shift in a direction perpendicular to the first horizontal lengthwise direction (e.g., along the horizontal direction within the plane B-B'). If the overlay variations is greater than the nominal distance between an edge of a via hole 33 and a sidewall of a first line cavity 19 that the via hole 33 is designed to overlie, the overlay variations can cause a via structure 24V to laterally contact a portion of a first dielectric cap material portion 18.

In another example, critical dimension (CD) variations can cause the area of a via hole 33 to be entirely within an area of a first dielectric cap material portion 18 such that a via structure is laterally surrounded by a first dielectric cap material portion 18, and does not contact the first dielectric material layer 12.

Figure 11B:
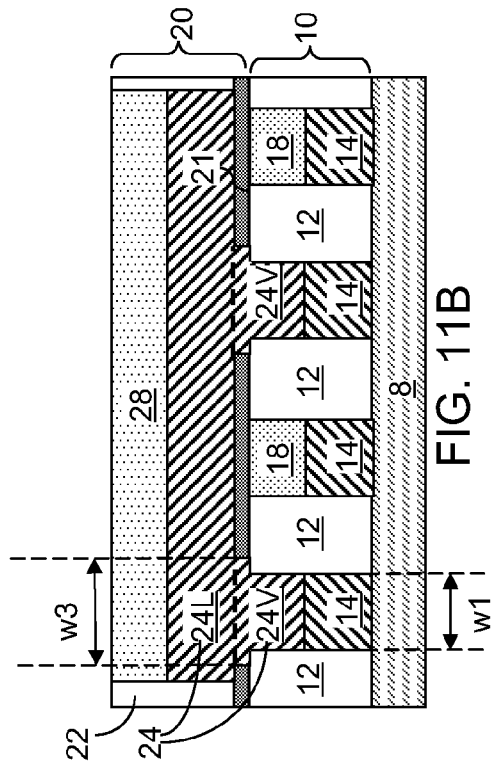
FIG. 11B is a schematic vertical cross-sectional view of the exemplary metal interconnect structure of FIG. 11A along the B-B' plane according to an embodiment of the present disclosure.
Figure 11C:
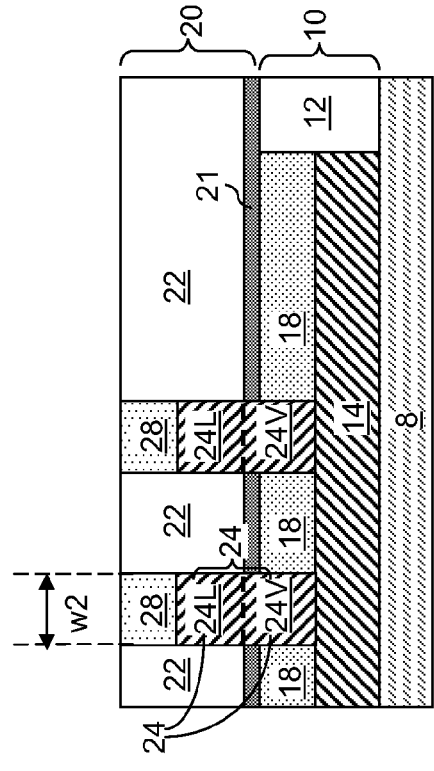
FIG. 11C is a schematic vertical cross-sectional view of the exemplary metal interconnect structure of FIG. 11A along the C-C' plane according to an embodiment of the present disclosure.
Figure 11A:
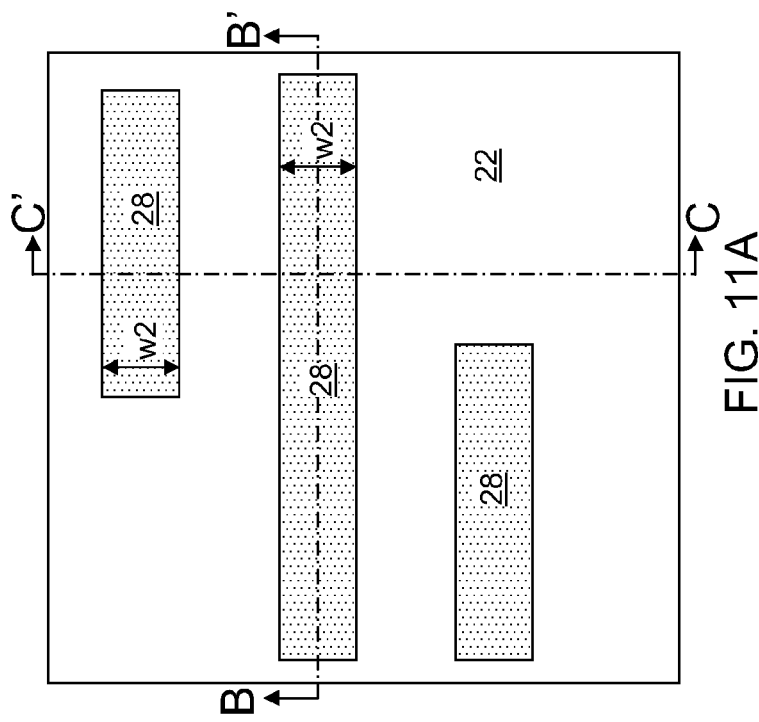
FIG. 11A is a schematic top-down view of the exemplary metal interconnect structure after formation of second dielectric cap material portions according to an embodiment of the present disclosure.

Referring to FIGS. 11A, 11B, and 11C, second dielectric cap material portions 28 can be formed in remaining portions of the dual damascene cavities 49. In one embodiment, the second dielectric cap material portions 28 can be formed by depositing a dielectric material that is different from the dielectric material of the second dielectric material layer 22, for example, by chemical vapor deposition, and by planarizing the deposited dielectric material employing the second dielectric material layer 22 as a stopping layer. In one embodiment, the second dielectric cap material portions 28 can include a material selected from silicon oxide, nitrogen-doped organosilicate glass, and silicon nitride. The planarization of the deposited dielectric material can be performed, for example, by chemical mechanical planarization (CMP), a recess etch, or a combination of CMP and a recess etch. In one embodiment, the top surface of each second dielectric cap material portion 28 can be coplanar with the top surface of the second dielectric material layer 22 after the planarizing.

In another embodiment, the second dielectric cap material portions 28 can be formed by depositing a self-planarizing dielectric material that is different from the dielectric material of the second dielectric material layer 22, for example, by spin-coating. For example, a spin-on-glass (SOG) material, or a self-planarizing low dielectric constant (low-k) dielectric material having a dielectric constant less than 3.9 (e.g., SiLK™) can be employed. Any excess portion of the self-planarizing dielectric material can be removed from above the top surface of the second dielectric material layer 22, for example, by a recess etch or CMP. In one embodiment, the top surface of each second dielectric cap material portion 28 can be coplanar with the top surface of the second dielectric material layer 22 after the recess etch or CMP.

In one embodiment, the second dielectric material layer 22 can include porous or non-porous organosilicate glass (OSG), and the dielectric cap material portions 28 can include a material having a greater dielectric constant than the second dielectric material layer 22.

In another embodiment, the second dielectric material layer 22 can include non-porous OSG, and the dielectric cap material portions 28 can include a porous OSG having a greater etch rate than the non-porous OSG of the second dielectric material layer 22.

A stack, from bottom to top, of a second metal line 24L and a second dielectric cap material portion 28 is formed within the second line trenches 29 (See FIGS. 6A, 6B, and 6C) in each dual damascene cavity 49 (See FIGS. 9A, 9B, and 9C). The second-level structure 20 includes stacks of a second metal line 24L and a second dielectric cap material portion 28 that are embedded within the second dielectric material layer 22 and an upper portion of the via structures 24V that are embedded within the optional etch stop layer 21.

The processing steps of FIGS. 5A-5C, 6A-6C, 7A-7C, 8A=8C, 9A-9C, 10A-10C, and 11A-11C can be repeated to generate higher level structures that have substantially the same structure as the second-level structure 20. In one embodiment, the orientations of metal lines in alternating levels can alternate along two different horizontal directions, which can be the first horizontal lengthwise direction and the second horizontal lengthwise direction. Thus, a metal interconnect structures having an arbitrary number of levels and including dual damascene line and via structure within each level can be formed employing the methods of embodiments of the present disclosure.

While the disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a metal interconnect structure comprising:
    forming a first line trench extending through a first dielectric material layer on a substrate;
    forming a stack, from bottom to top, of a first metal line and a dielectric cap material portion within said first line trench, said dielectric cap material portion having a top surface coplanar with a top surface of said first dielectric material layer;
    forming a second dielectric material layer over said first dielectric material layer and said stack;
    forming a second line trench extending through said second dielectric material layer;
    forming a via cavity extending to a top surface of said first metal line underneath said second line trench by removing a portion of said dielectric cap material portion, wherein said via cavity is laterally surrounded by said first dielectric material layer; and
    forming a dual damascene line and via structure including a second metal line located within said second line trench and a via structure located within said via cavity.

2. The method of claim 1, wherein said forming of said dual damascene line and via structure comprises:
    depositing at least one conductive material within said second line trench and said via cavity; and
    recessing said at least one conductive material below a top surface of said second dielectric material layer to form said dual damascene line and via structure.

3. The method of claim 1, wherein said dual damascene line and via structure is formed as an integral structure without a physically manifested interface between said second metal line and said via structure.

4. The method of claim 1, wherein said forming of said first line trench further comprises:
    applying and patterning a photoresist layer over said first dielectric material layer; and
    transferring a pattern in said patterned photoresist layer to a bottommost surface of said first dielectric material layer.

5. The method of claim 1, wherein said forming of said stack comprises:
    depositing a conductive material within said first line trench;
    recessing a top surface of said conductive material to a height lower than said top surface of said first dielectric material layer to form said first metal line; and
    depositing and planarizing a dielectric material different from a dielectric material of said first dielectric material layer within said first line trench and above said first metal line to foam said first dielectric cap material portion.

6. The method of claim 1, wherein said first dielectric material layer comprises an organosilicate glass (OSG), and said first dielectric cap material portion comprises a material selected from silicon oxide, nitrogen-doped organosilicate glass, and silicon nitride.

7. The method of claim 1, wherein said forming of said via cavity comprises:
    applying a photoresist layer over said second dielectric material layer and within said second line trench; and
    lithographically patterning said photoresist layer with a via pattern including at least one via hole, wherein said removed portion of said dielectric cap material portion is etched employing said first dielectric material layer and said second dielectric material layer as etch mask layers.

8. The method of claim 7, wherein said removed portion of said dielectric cap material portion has a horizontal cross-sectional area of a composite pattern that is an intersection of said via pattern, a pattern of said second line trench, and a pattern of said dielectric cap material portion.

9. The method of claim 1, further comprising:
    forming an etch stop layer over said first dielectric material layer and said dielectric cap material portion;
    applying, and patterning with a via pattern including at least one via hole, a photoresist layer over said second dielectric material layer and within said second line trench;
    transferring a pattern that is an intersection of said via pattern and a pattern of said second line trench into said etch stop layer.

10. A method of forming a semiconductor structure comprising:
    forming a first dielectric material layer on a substrate;
    forming a stack, from bottom to top, of a first metal line and a dielectric cap material portion within said first dielectric material layer, wherein said stack has a first width in a first direction perpendicular to a lengthwise direction of said stack, and said dielectric cap material portion has a top surface coplanar with a top surface of said first dielectric material layer;

forming a second dielectric material layer over said first dielectric material layer and said stack; and forming a dual damascene line and via structure including a second metal line and a via structure, wherein said second metal line is embedded within said second dielectric material layer and said via structure is embedded within said first dielectric material layer, wherein said dual damascene line and via structure has a second width in a second direction perpendicular to a lengthwise direction of said dual damascene line and via structure, and said via structure has said first width in said first direction, a bottom surface of said via structure in direct contact with a portion of a top surface of said first metal line.

11. The method of claim 10, wherein said forming of said dual damascene line and via structure comprises:

depositing at least one conductive material within a second line trench located in said second dielectric material and a via cavity located in said first dielectric material; and recessing said at least one conductive material below a top surface of said second dielectric material layer to form said dual damascene line and via structure.

12. The method of claim 11, wherein said forming of said first line trench comprises:

applying and patterning a photoresist layer over said first dielectric material layer; and transferring a pattern in said patterned photoresist layer to a bottommost surface of said first dielectric material layer.

13. The method of claim 12, wherein said forming of said stack comprises:

depositing a conductive material within said first line trench located in said first dielectric material layer;

recessing a top surface of said conductive material to a height lower than said top surface of said first dielectric material layer to form said first metal line; and depositing and planarizing a dielectric material different from a dielectric material of said first dielectric material layer within said first line trench and above said first metal line to form said first dielectric cap material portion.

14. The method of claim 11, wherein said via cavity is formed by:

applying a photoresist layer over said second dielectric material layer and within said second line trench; and lithographically patterning said photoresist layer with a via pattern including at least one via hole, wherein said removed portion of said dielectric cap material portion is etched employing said first dielectric material layer and said second dielectric material layer as etch mask layers.

15. The method of claim 10, wherein said dual damascene line and via structure is formed as an integral structure without a physically manifested interface between said second metal line and said via structure.

16. The method of claim 10, wherein said first dielectric material layer comprises an organosilicate glass (OSG), and said first dielectric cap material portion comprises a material selected from silicon oxide, nitrogen-doped organosilicate glass, and silicon nitride.

* * * * *